United States Patent
Nishiwaki

(10) Patent No.: US 10,153,168 B2
(45) Date of Patent: Dec. 11, 2018

(54) METHOD OF MANUFACTURING SEMICONDUCTOR DEVICE

(71) Applicant: TOYOTA JIDOSHA KABUSHIKI KAISHA, Toyota-shi, Aichi (JP)

(72) Inventor: Tsuyoshi Nishiwaki, Nagoya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/808,560

(22) Filed: Nov. 9, 2017

(65) Prior Publication Data
US 2018/0182625 A1    Jun. 28, 2018

(30) Foreign Application Priority Data

Dec. 22, 2016 (JP) .................... 2016-249472

(51) Int. Cl.
| | |
|---|---|
| H01L 21/225 | (2006.01) |
| H01L 21/02 | (2006.01) |
| H01L 21/265 | (2006.01) |
| H01L 21/268 | (2006.01) |
| H01L 21/324 | (2006.01) |
| H01L 27/06 | (2006.01) |

(52) U.S. Cl.
CPC .... *H01L 21/2253* (2013.01); *H01L 21/02532* (2013.01); *H01L 21/02592* (2013.01); *H01L 21/02675* (2013.01); *H01L 21/268* (2013.01); *H01L 21/26513* (2013.01); *H01L 21/324* (2013.01); *H01L 27/0664* (2013.01)

(58) Field of Classification Search
CPC ........... H01L 21/2253; H01L 21/02675; H01L 21/268; H01L 21/324; H01L 21/02592
See application file for complete search history.

(56) References Cited

U.S. PATENT DOCUMENTS

| | | | |
|---|---|---|---|
| 9,679,773 B1 * | 6/2017 | Engelhardt | H01L 21/225 |
| 2011/0176568 A1 * | 7/2011 | Satoh | B82Y 20/00 |
| | | | 372/44.01 |
| 2015/0170918 A1 | 6/2015 | Wakabayashi | |

FOREIGN PATENT DOCUMENTS

JP    2014-036110 A    2/2014

* cited by examiner

*Primary Examiner* — Jay C Chang
*Assistant Examiner* — Mikka Liu
(74) *Attorney, Agent, or Firm* — Oliff PLC

(57) ABSTRACT

A method of manufacturing a semiconductor device includes: forming a light absorbing layer on a front surface of a semiconductor substrate or in the semiconductor substrate; forming a high concentration layer, in which an impurity concentration is increased, by implanting impurities into the semiconductor substrate; and heating the high concentration layer so as to activate the impurities in the high concentration layer. The formation of the light absorbing layer and the formation of the high concentration layer are performed such that the light absorbing layer and the high concentration layer at least partially overlap each other. The high concentration layer is heated by irradiating the high concentration layer with light from a front surface side of the semiconductor substrate in the heating of the high concentration layer.

8 Claims, 5 Drawing Sheets

METHOD OF MANUFACTURING SEMICONDUCTOR DEVICE

TECHNICAL FIELD

The technique disclosed herein relates to a method of manufacturing a semiconductor device.

BACKGROUND

Japanese Patent Application Publication No. 2014-036110 discloses a technique in which impurities are implanted into a front surface of a semiconductor substrate, and then the front surface is irradiated with a laser such that the impurities implanted into the semiconductor substrate are activated. Further, in this technique, the front surface of the semiconductor substrate is irradiated with lasers of two types having different pulse durations such that increase in temperature of a rear surface of the semiconductor substrate (an opposite surface to the front surface of the semiconductor substrate which is irradiated with the light) is suppressed.

SUMMARY

In recent years, semiconductor substrates have been becoming thinner and thinner. Thus, at a time of activating impurities in a semiconductor substrate by light irradiation, a rear surface of the semiconductor substrate is likely to increase in temperature. Under such circumstances, the disclosure herein provides a technique capable of favorably suppressing an increase in temperature of a rear surface of a semiconductor substrate when impurities are activated by irradiating a front surface of the semiconductor substrate with light.

A method of manufacturing a semiconductor device disclosed herein may comprise forming a light absorbing layer, forming a high concentration layer, and heating the high concentration layer. In the formation of the light absorbing layer, a light absorbing layer is formed on a front surface of a semiconductor substrate or in the semiconductor substrate. The semiconductor substrate includes the front surface and a rear surface. The light absorbing layer has a light absorption rate higher than a light absorption rate of a semiconductor layer adjacent to the light absorbing layer. Here, the light absorbing layer is formed such that the light absorbing layer is distributed in a portion closer to the front surface than to the rear surface. In the formation of the high concentration layer, a high concentration layer, in which an impurity concentration is increased, is formed by implanting impurities into the semiconductor substrate. In the heating of the high concentration layer, the impurities in the high concentration layer are activated. The formation of the light absorbing layer and the formation of the high concentration layer are performed such that the light absorbing layer and the high concentration layer at least partially overlap each other. The high concentration layer is heated by irradiating the high concentration layer with light from a front surface side of the semiconductor substrate in the heating of the high concentration layer.

Note that, the light absorbing layer may be formed on a front surface of an original semiconductor substrate (semiconductor substrate for which the light absorbing layer has not been yet formed), or may be formed in the original semiconductor substrate. If the light absorbing layer is formed on the front surface of the original semiconductor substrate, an entirety of the light absorbing layer and the original semiconductor substrate is collectively referred to as "semiconductor substrate" for which the light absorbing layer has already been formed. In other words, "the semiconductor substrate" for which the light absorbing layer has already been formed includes the light absorbing layer.

Further, which of the formation of the light absorbing layer and the formation of the high concentration layer is performed first is not limited. When the formation of the high concentration layer is performed after the formation of the light absorbing layer, the high concentration layer may be formed in any portion as long as the high concentration layer at least partially overlaps the light absorbing layer in that portion. For example, the high concentration layer may be formed only within the light absorbing layer, or the high concentration layer may be formed across an inside and an outside of the light absorbing layer. Further, when the formation of the light absorbing layer is performed after the formation of the high concentration layer, the light absorbing layer may be formed in any portion as long as the light absorbing layer at least partially overlaps the high concentration layer in that portion. For example, the light absorbing layer may be formed only within the high concentration layer, or the light absorbing layer may be formed across an inside and an outside of the high concentration layer.

In this manufacturing method, in the heating of the high concentration layer, the light is radiated from the front surface side of the semiconductor substrate to the high concentration layer. The radiated light is efficiently absorbed in the light absorbing layer, and the light absorbing layer is efficiently heated. The light absorbing layer and the high concentration layer at least partially overlap each other, and hence the high concentration layer is also efficiently heated. As such, the high concentration layer is efficiently heated, and the impurities in the high concentration layer are activated. Further, the light absorption rate of the light absorbing layer is high, and hence the light scarcely reaches a rear surface side with respect to the light absorbing layer. Thus, an increase in temperature on the rear surface side with respect to the light absorbing layer is suppressed. As a result, an increase in temperature of the rear surface of the semiconductor substrate is suppressed. Therefore, by this manufacturing method, while suppressing the increase in the temperature of the rear surface, the impurities in the high concentration layer can be activated.

DETAILED DESCRIPTION

Figure 1:
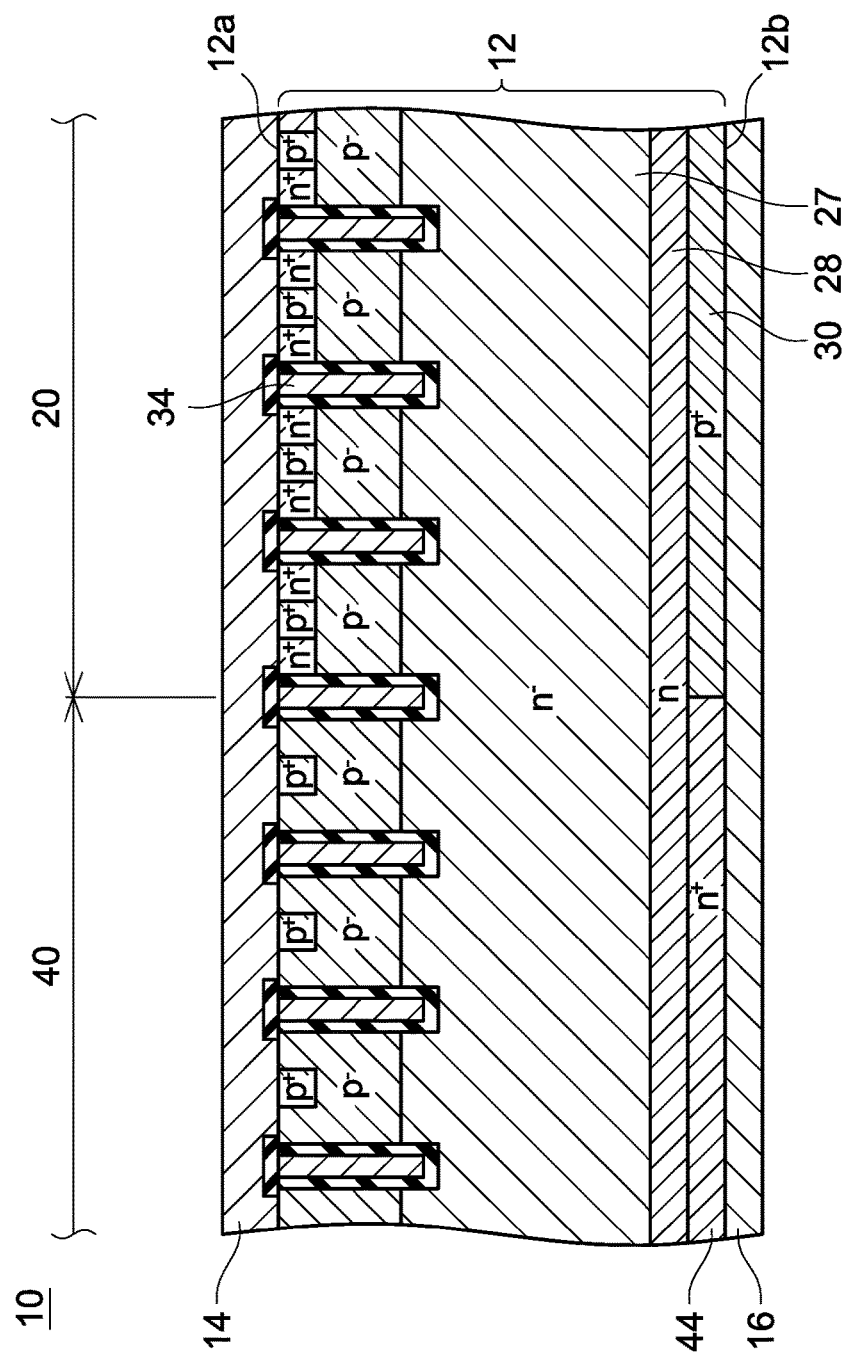
FIG. 1 is a cross-sectional view of a semiconductor device.

FIG. 1 shows a semiconductor device 10 that is manufactured by manufacturing methods of a first embodiment and a second embodiment to be described later. The semiconductor device 10 includes a semiconductor substrate 12, an upper electrode 14, and a lower electrode 16. The semiconductor substrate 12 is constituted of a silicon single crystal. The upper electrode 14 is in contact with an upper surface 12a of the semiconductor substrate 12. The lower electrode 16 is in contact with a lower surface 12b of the semiconductor substrate 12. The semiconductor substrate 12 includes an IGBT (insulated gate bipolar transistor) region 20 that operates as an IGBT, and a diode region 40 that operates as a diode. When the IGBT in the IGBT region 20 operates, the upper electrode 14 functions as an emitter electrode, and the lower electrode 16 functions as a collector electrode. When the diode in the diode region 40 operates, the upper electrode 14 functions as an anode electrode, and the lower electrode 16 functions as a cathode electrode. In a portion on an upper surface 12a side in the IGBT region 20, n-type source regions, a p-type body region, trench gate electrodes 34, and the like are provided. In a portion on the upper surface 12a side in the diode region 40, a p-type anode region and the like are provided. These structures on the upper surface 12a side in the IGBT region 20 and the diode region 40 are conventionally known, and hence detail description thereof is omitted.

In a portion on a lower surface 12b side in the semiconductor substrate 12, a drift layer 27, a buffer layer 28, a collector layer 30, and a cathode layer 44 are provided. The drift layer 27 is an n-type layer having a low n-type impurity concentration. The drift layer 27 is distributed across the IGBT region 20 and the diode region 40. The buffer layer 28 is an n-type layer having an n-type impurity concentration higher than that of the drift layer 27. The buffer layer 28 is disposed under the drift layer 27. The buffer layer 28 is distributed across the IGBT region 20 and the diode region 40. The collector layer 30 is a p-type layer. The collector layer 30 is disposed under the buffer layer 28 in the IGBT region 20. The collector layer 30 is in ohmic contact with the lower electrode 16 at the lower surface 12b. The cathode layer 44 is an n-type layer having an n-type impurity concentration higher than that of the buffer layer 28. The cathode layer 44 is disposed under the buffer layer 28 in the diode region 40. The cathode layer 44 is in ohmic contact with the lower electrode 16 at the lower surface 12b.

(First Embodiment)

Figure 2:
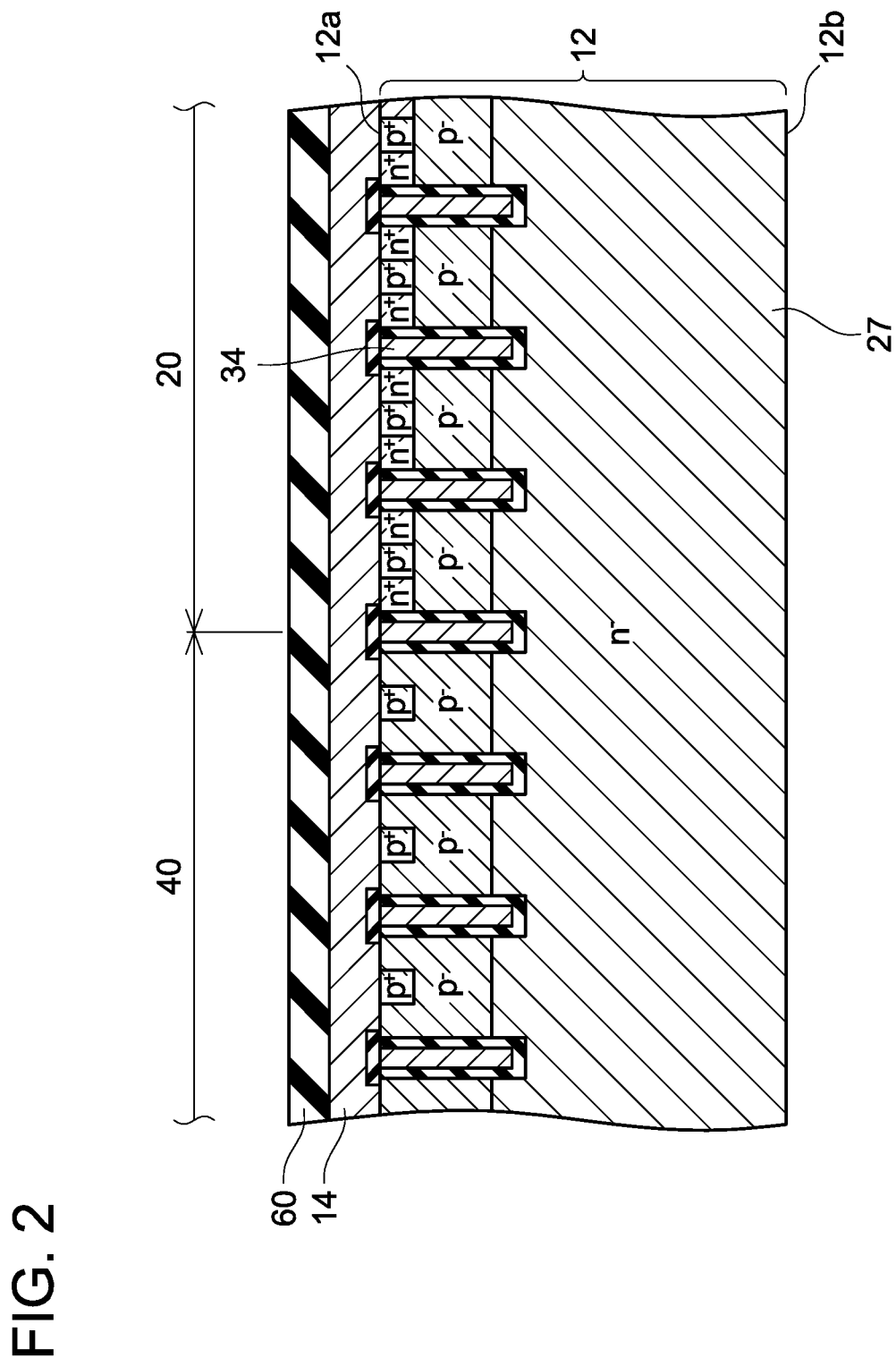
FIG. 2 is a cross-sectional view of a semiconductor substrate after a formation of a structure on an upper-surface side.

Next, the manufacturing method of the first embodiment will be described. First, the semiconductor substrate 12 constituted of an n-type silicon single crystal is prepared. Then, as shown in FIG. 2, the structures on the upper surface 12a side of the semiconductor device 10 are formed by conventionally known methods. Next, a protective tape 60 is applied to a surface of the upper electrode 14. After that, the lower surface 12b of the semiconductor substrate 12 is grinded such that the semiconductor substrate 12 is made thinner. At this point, a thickness of the semiconductor substrate 12 becomes equal to or less than 140 μm. Further, at this point, the drift layer 27 is exposed at the lower surface 12b of the semiconductor substrate 12.

Figure 3:
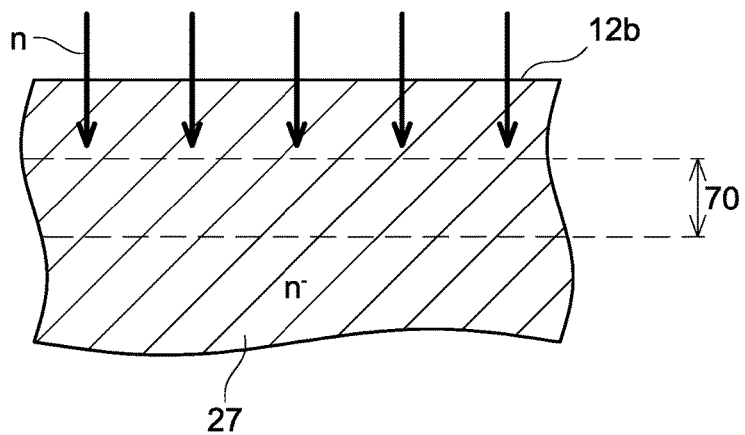
FIG. 3 is an explanatory view showing a formation of a high concentration layer (enlarged cross-sectional view of a vicinity of a lower surface)
Figure 4:
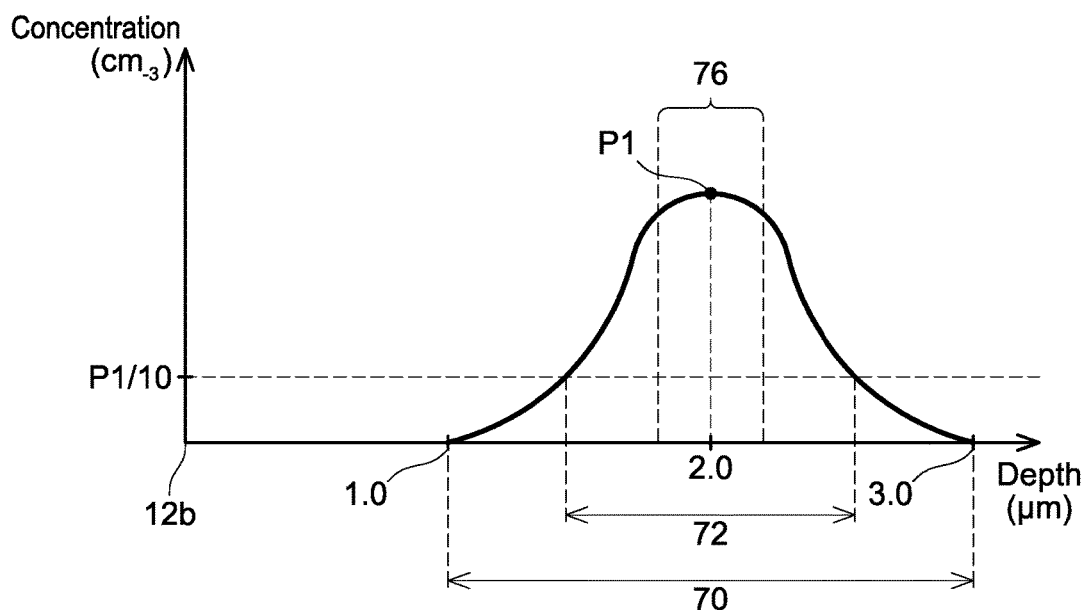
FIG. 4 is a graph showing a distribution of an n-type impurity concentration in the high concentration layer.

Next, as shown in FIG. 3, n-type impurities (in this embodiment, phosphorus) are ion-implanted into the semiconductor substrate 12 from the lower surface 12b. Here, the n-type impurities are implanted such that the n-type impurities stop averagely at a depth of approximately 2 μm from the lower surface 12b. With this, a high concentration layer 70 in which the n-type impurity concentration has been increased as compared to before the implantation is formed in the semiconductor substrate 12. FIG. 4 shows a distribution of the n-type impurity concentration within and around the high concentration layer 70. The n-type impurity concentration represented by an ordinate axis in FIG. 4 is substantially equal to an amount of increase in the n-type impurities increased by the implantation of the n-type impurities. As shown in FIG. 4, the high concentration layer 70 is formed in a portion ranging from a depth of approximately 1 μm to a depth of approximately 3 μm with a position at the depth of approximately 2 μm as its center. Further, a peak value P1 of the n-type impurity concentration in the high concentration layer 70 is obtained at the position at the depth of approximately 2 μm. Hereinbelow, a part having an n-type impurity concentration equal to or higher than one tenth of the peak value P1 within the high concentration layer 70 will be referred to as a main layer 72.

Figure 5:
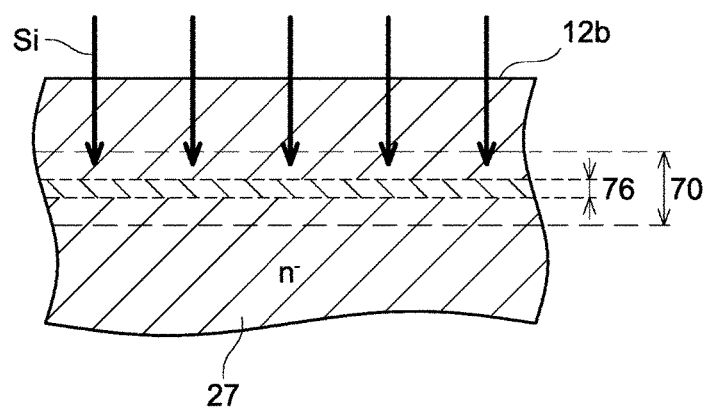
FIG. 5 is an explanatory view showing a formation of an amorphous layer (enlarged cross-sectional view of the vicinity of the lower surface)

Next, as shown in FIG. 5, inert ions (in this embodiment, silicon) are implanted into the semiconductor substrate 12 from the lower surface 12b. Here, the inert ions are implanted such that the inert ions averagely stop at the depth of approximately 2 μm from the lower surface 12b. Crystal defects are generated at the stop position of the inert ions. Here, the inert ions are implanted by a dose equal to or more than $8 \times 10^{14}$ cm$^{-2}$. When the inert ions are implanted by such a high dose, crystallinity of the semiconductor substrate (that is, single crystal silicon) is impaired around the average stop position, and an amorphous layer 76 (that is, amorphous silicon) is formed. The amorphous layer 76 has a light absorption rate higher than a light absorption rate of a semiconductor layer adjacent to the amorphous layer 76 (semiconductor layer having crystallinity). Further, the amorphous layer 76 has a thermal conductivity lower than a thermal conductivity of the semiconductor layer adjacent to the amorphous layer 76 (semiconductor layer having crystallinity). As shown in FIG. 4 and FIG. 5, the amorphous layer 76 is formed to overlap the depth at which the peak value P1 of the n-type impurity concentration is obtained. Further, the amorphous layer 76 is formed such that an entirety of the amorphous layer 76 is located within the main layer 72 of the high concentration layer 70.

After that, n-type impurities (in this embodiment, phosphorus) are implanted into a portion corresponding to the cathode layer 44, and p-type impurities (in this embodiment, boron) are implanted into a portion corresponding to the collector layer 30.

Then, the lower surface 12b of the semiconductor substrate 12 is irradiated with an IR laser (infrared laser). The IR laser refers to a laser having a wavelength of approximately 808 nm. The IR laser has a penetration depth of approximately 10.7 μm with respect to the single crystal silicon at room temperature. Note that, the penetration depth refers to a depth at which energy of a laser is attenuated to 1/e (e≈2.718), where the energy of the laser at a surface is "1". The penetration depth of the IR laser is larger than the depth of the amorphous layer 76 (approximately 2 μm), and hence the laser radiated to the lower surface 12b reaches the amorphous layer 76.

As described above, the light absorption rate of the amorphous layer 76 is high. Thus, the laser is efficiently absorbed in the amorphous layer 76, and the amorphous layer 76 is efficiently heated. As a result, in a portion overlapping the amorphous layer 76, the high concentration layer 70 is efficiently heated. Further, also in a portion adjacent to the amorphous layer 76, the high concentration layer 70 is heated due to transfer of the heat from the amorphous layer 76 and the absorption of the laser. Thus, an entirety of the high concentration layer 70 is heated to a high temperature.

In addition, the laser is absorbed in the amorphous layer 76, and hence the laser is sharply attenuated in the amorphous layer 76. Thus, the laser scarcely reaches the upper surface 12a side with respect to the amorphous layer 76. Further, the thermal conductivity of the amorphous layer 76 is low, and hence heat is difficult to transfer to the upper surface 12a side with respect to the amorphous layer 76. Thus, an increase in temperature of the upper surface 12a is suppressed.

When the amorphous layer 76 is provided as such, the increase in the temperature of the upper surface 12a can be suppressed, and the amorphous layer 76 and the high concentration layer 70 can be efficiently heated. When the increase in the temperature of the upper surface 12a is suppressed, deteriorations of the protective tape 60 and the upper electrode 14 are suppressed. Further, when the increase in the temperature of the upper surface 12a is suppressed, dispersion of the impurities in the semiconductor layer on the upper surface 12a side is suppressed. As a result, the semiconductor devices 10 can be manufactured with stable properties. In addition, the amorphous layer 76 is crystalized when heated. Substantially the entirety of the amorphous layer 76 is crystalized during the irradiation with the IR laser. Further, in the high concentration layer 70, the n-type impurities are electrically activated by the heating. With this, the n-type buffer layer 28 is formed.

Next, the lower surface 12b of the semiconductor substrate 12 is irradiated with a green laser so as to heat a portion in a vicinity of the lower surface 12b of the semiconductor substrate 12. The green laser refers to a laser having a wavelength of approximately 532 nm. The green laser has a penetration depth of approximately 0.96 μm with respect to the single crystal silicon at room temperature. The penetration depth of the green laser with respect to the single crystal silicon is short, and hence a surface portion in the vicinity of the lower surface 12b is efficiently heated. With this, the p-type impurities and the n-type impurities that were implanted into this surface portion are activated. In this way, the collector layer 30 and the cathode layer 44 are formed.

After that, the lower electrode 16 is formed to cover the lower surface 12b, and the protective tape 60 is removed. With this, the semiconductor device 10 of FIG. 1 is completed. The protective tape 60 has not been exposed to a high temperature, and hence the protective tape 60 has not altered in properties. Thus, the protective tape 60 can be favorably removed.

In the aforementioned first embodiment, the position at which the peak value P1 of the n-type impurity concentration is obtained overlaps the position of the amorphous layer 76, and the amorphous layer 76 is formed so as to be included within the main layer 72 of the high concentration layer 70. However, as long as the amorphous layer 76 is formed such that at least a part of the amorphous layer 76 overlaps at least a part of the high concentration layer 70, the portion in which the amorphous layer 76 is formed may be changed as appropriate. When the amorphous layer 76 is formed such that at least a part of the amorphous layer 76 overlaps at least a part of the high concentration layer 70, the high concentration layer 70 can be efficiently heated, and the increase in the temperature of the upper surface 12a can be suppressed. For example, the amorphous layer 76 may be provided in an outside of the main layer 72 and within the high concentration layer 70. Alternatively, for example, the amorphous layer 76 may be provided across an inside of the high concentration layer 70 and an outside of the high concentration layer 70. However, note that, as in the first embodiment, when the position at which the peak value P1 of the n-type impurity concentration is obtained overlaps the position of the amorphous layer 76, and when the amorphous layer 76 is formed within the main layer 72 of the high concentration layer 70, the high concentration layer 70 can be more efficiently heated. Thus, the high concentration layer 70 can be heated with a small amount of energy, and an amount of heat that is applied to the semiconductor substrate 12 does not have to be large. As a result, the increase in the temperature of the upper surface 12a can be further suppressed.

Further, in the aforementioned first embodiment, the formation of the amorphous layer 76 is performed after the formation of the high concentration layer 70. However, the formation of the amorphous layer 76 may be performed before the formation of the high concentration layer 70.

(Second Embodiment)

Figure 6:
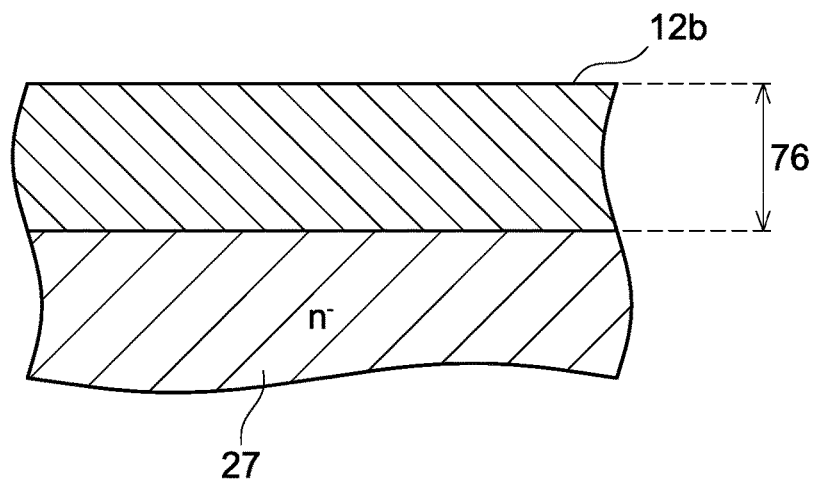
FIG. 6 is an explanatory view showing another formation of the amorphous layer (enlarged cross-sectional view of the vicinity of the lower surface)

Next, the manufacturing method of the second embodiment will be described. Same as in the manufacturing method of the first embodiment, the structure of FIG. 2 is obtained also in the manufacturing method of the second embodiment. Then, as shown in FIG. 6, the amorphous layer 76 constituted of amorphous silicon is grown on the lower surface 12b of the semiconductor substrate 12. The amorphous layer 76 can be grown by, for example, LPCVD (low pressure chemical vapor deposition), plasma CVD, or optical CVD. Here, the amorphous layer 76 is formed to have a thickness equal to or less than 3 μm. Note that, hereinbelow, the semiconductor substrate 12 for which the amorphous layer 76 has not yet been formed and the amorphous layer 76 will be collectively referred to as the semiconductor substrate 12. Thus, a surface of the amorphous layer 76 will be referred to as the lower surface 12b of the semiconductor substrate 12.

Figure 7:
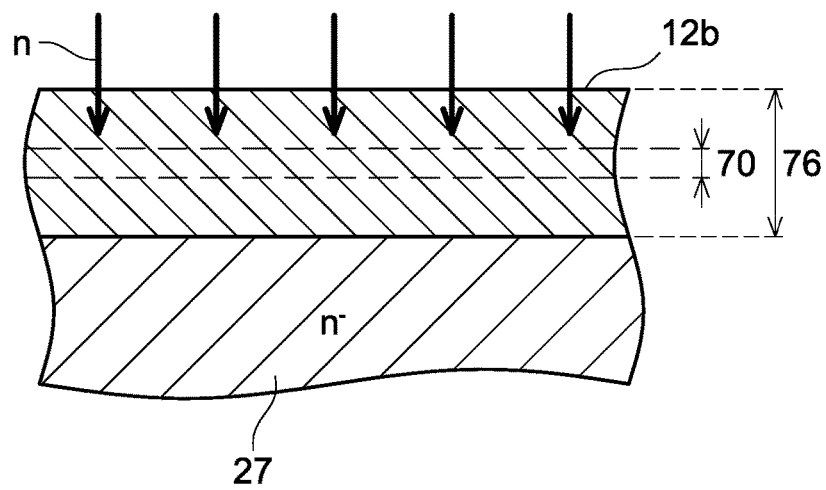
FIG. 7 is an explanatory view showing another formation of the high concentration layer (enlarged cross-sectional view of the vicinity of the lower surface).

Next, as shown in FIG. 7, n-type impurities (in this embodiment, phosphorus) are implanted into the amorphous layer 76 from the lower surface 12b. Here, the n-type impurities are implanted such that the n-type impurities averagely stop at the depth of approximately 2 μm from the lower surface 12b. With this, the high concentration layer 70 in which the n-type impurity concentration has been increased as compared to before the implantation is formed in the amorphous layer 76. As shown in FIG. 7, the entirety of the high concentration layer 70 is contained within the amorphous layer 76.

After that, n-type impurities (in this embodiment, phosphorus) are implanted into the portion corresponding to the cathode layer 44 in a surface portion of the amorphous layer 76, and p-type impurities (in this embodiment, boron) are implanted into the portion corresponding to the collector layer 30 in the surface portion of the amorphous layer 76.

Then, the lower surface 12b of the semiconductor substrate 12 is irradiated with the IR laser (infrared laser). In the second embodiment, the amorphous layer 76 is exposed on the lower surface 12b, and hence the amorphous layer 76 is irradiated with the IR laser. The light absorption rate of the amorphous layer 76 is high, and hence the laser is efficiently absorbed in the amorphous layer 76, and the amorphous layer 76 is efficiently heated. As a result, the entirety of the high concentration layer 70 overlapping the amorphous layer 76 is efficiently heated.

In addition, the laser is absorbed in the amorphous layer 76, and hence the laser is sharply attenuated in the amorphous layer 76. Thus, the laser scarcely reaches the upper surface 12a side with respect to the amorphous layer 76. Further, the thermal conductivity of the amorphous layer 76 is low, and hence heat is difficult to transfer to the upper surface 12a side with respect to the amorphous layer 76. Thus, the increase in the temperature of the upper surface 12a is suppressed.

When the amorphous layer 76 is provided as such, the increase in the temperature of the upper surface 12a can be suppressed, and the amorphous layer 76 and the high concentration layer 70 can be efficiently heated. The amorphous layer 76 is crystalized when heated. Further, in the high concentration layer 70, the n-type impurities are activated by the heating. With this, the n-type buffer layer 28 is formed.

Next, the lower surface 12b of the semiconductor substrate 12 is irradiated with the green laser so as to heat a portion in the vicinity of the lower surface 12b of the semiconductor substrate 12. The penetration depth of the green laser with respect to the single crystal silicon is short, and hence the surface portion in the vicinity of the lower surface 12b is efficiently heated. With this, the p-type impurities and the n-type impurities that have been implanted into this surface portion are activated. In this way, the collector layer 30 and the cathode layer 44 are formed.

After that, the lower electrode 16 is formed to cover the lower surface 12b, and the protective tape 60 is removed. With this, the semiconductor device 10 of FIG. 1 is completed. The protective tape 60 has not been exposed to a high temperature, and hence the protective tape 60 has not altered in properties. Thus, the protective tape 60 can be favorably removed.

Note that, the entirety of the high concentration layer 70 is contained within the amorphous layer 76 in the aforementioned second embodiment, however, the high concentration layer 70 may be distributed across an inside of the amorphous layer 76 and an outside of the amorphous layer 76.

Further, the high concentration layer 70 is heated with the laser in the aforementioned first and the second embodiments, however, the high concentration layer 70 may be heated with light other than the laser.

Now, relationships between the constituent elements of the embodiments and the constituent elements in the claims are described. The lower surface 12b of the semiconductor substrate 12 of the embodiments is an example of "front surface of a semiconductor substrate" in the claims. The upper surface 12a of the semiconductor substrate 12 of the embodiments is an example of "rear surface of the semiconductor substrate" in the claims. The amorphous layer 76 of the embodiments is an example of "light absorbing layer" in the claims.

Some of the technical elements disclosed herein will hereafter be listed. It should be noted that each of the technical elements below is independently useful.

In a manufacturing method example disclosed herein, the high concentration layer may include a main layer having an amount of increase in the impurity concentration which is equal to or higher than 10% of a peak value of an amount of increase in the impurity concentration in the high concentration layer. The formation of the light absorbing layer and the formation of the high concentration layer may be performed such that the light absorbing layer and the main layer at least partially overlap each other.

According to this configuration, the main layer of the high concentration layer can be efficiently heated.

In a manufacturing method example disclosed herein, the formation of the light absorbing layer and the formation of the high concentration layer may be performed such that an entirety of the light absorbing layer is located within the main layer.

According to this configuration, the main layer of the high concentration layer can be further efficiently heated.

In a manufacturing method example disclosed herein, the formation of the light absorbing layer and the formation of the high concentration layer may be performed such that the light absorbing layer and a position in the high concentration layer at which a peak value of an amount of increase in the impurity concentration is obtained overlap each other.

According to this configuration, the position in the high concentration layer at which the peak value is obtained can be efficiently heated.

In a manufacturing method example disclosed herein, the light absorbing layer may be a layer in which a crystal defect density is increased by implanting inert ions into the semiconductor substrate.

Note that, as the inert ions, for example, silicon, helium, neon, and argon may be used.

In a manufacturing method example disclosed herein, the light absorbing layer may be crystalized in the heating of the high concentration layer.

According to this configuration, semiconductor devices having better properties can be manufactured.

While specific examples of the present invention have been described above in detail, these examples are merely illustrative and place no limitation on the scope of the patent claims. The technology described in the patent claims also encompasses various changes and modifications to the specific examples described above. The technical elements explained in the present description or drawings provide technical utility either independently or through various combinations. The present invention is not limited to the combinations described at the time the claims are filed. Further, the purpose of the examples illustrated by the present description or drawings is to satisfy multiple objectives simultaneously, and satisfying any one of those objectives gives technical utility to the present invention.

What is claimed is:

1. A method of manufacturing a semiconductor device, the method comprising:
    forming a light absorbing layer on a front surface of a semiconductor substrate or in the semiconductor substrate, the semiconductor substrate including the front surface and a rear surface, the light absorbing layer being formed such that the light absorbing layer is distributed in a portion closer to the front surface than to the rear surface, the light absorbing layer having a light absorption rate higher than a light absorption rate of a semiconductor layer adjacent to the light absorbing layer;
    forming a high concentration layer, in which an impurity concentration is increased, by implanting impurities into the semiconductor substrate; and
    heating the high concentration layer so as to activate the impurities in the high concentration layer,
    wherein
    the formation of the light absorbing layer and the formation of the high concentration layer are performed such that the light absorbing layer and the high concentration layer at least partially overlap each other,
    the high concentration layer is heated by irradiating the high concentration layer with light from a front surface side of the semiconductor substrate in the heating of the high concentration layer,
    the high concentration layer includes a main layer having an amount of increase in the impurity concentration which is equal to or higher than 10% of a peak value of an amount of increase in the impurity concentration in the high concentration layer, and the formation of the light absorbing layer and the formation of the high concentration layer are performed such that the light absorbing layer and the main layer at least partially overlap each other.

2. The method of claim 1, wherein the formation of the light absorbing layer and the formation of the high concentration layer are performed such that an entirety of the light absorbing layer is located within the main layer.

3. The method of claim 1, wherein the formation of the light absorbing layer and the formation of the high concentration layer are performed such that the light absorbing layer and a position in the high concentration layer at which a peak value of an amount of increase in the impurity concentration is obtained overlap each other.

4. The method of claim 1, wherein the light absorbing layer is a layer in which a crystal defect density is increased by implanting inert ions into the semiconductor substrate.

5. The method of claim 1, wherein the light absorbing layer is an amorphous layer grown on the front surface of the semiconductor substrate for which the light absorbing layer has not been yet formed.

6. The method of claim 4, wherein the light absorbing layer is crystalized in the heating of the high concentration layer.

7. The method of claim 5, wherein the light absorbing layer is crystalized in the heating of the high concentration layer.

8. The method of claim 1, wherein
the semiconductor substrate is a silicon substrate, and
the light absorbing layer is an amorphous silicon layer.

* * * * *